US012568863B2

(12) United States Patent
Pu et al.

(10) Patent No.: US 12,568,863 B2
(45) Date of Patent: Mar. 3, 2026

(54) DISPLAY PANEL AND MANUFACTURING METHOD THEREOF

(71) Applicant: HKC CORPORATION LIMITED, Shenzhen (CN)

(72) Inventors: Yang Pu, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 510 days.

(21) Appl. No.: 18/145,568

(22) Filed: Dec. 22, 2022

(65) Prior Publication Data
US 2023/0387371 A1      Nov. 30, 2023

(30) Foreign Application Priority Data
May 30, 2022      (CN) .......................... 202210599996.7

(51) Int. Cl.
| | |
|---|---|
| *H01L 25/075* | (2006.01) |
| *H10H 20/01* | (2025.01) |
| *H10H 20/831* | (2025.01) |
| *H10H 20/857* | (2025.01) |
| *H10H 29/01* | (2025.01) |
| *H10H 29/03* | (2025.01) |

(Continued)

(52) U.S. Cl.
CPC ....... *H01L 25/0753* (2013.01); *H10H 20/019* (2025.01); *H10H 20/857* (2025.01); *H10H 29/012* (2025.01); *H10H 29/03* (2025.01); *H10H 29/032* (2025.01); *H10H 29/8321* (2025.01); *H10H 29/8508* (2025.01); *H10H 20/8312* (2025.01)

(58) Field of Classification Search
CPC ... H01L 25/0753; H01L 25/167; H10H 29/39; H10H 29/8321; H10H 29/8508; H10H 20/8312
See application file for complete search history.

(56) References Cited

U.S. PATENT DOCUMENTS

| | | | |
|---|---|---|---|
| 8,241,932 B1 | 8/2012 | Yu et al. | |
| 2009/0272994 A1 | 11/2009 | Lim | |

FOREIGN PATENT DOCUMENTS

| | | |
|---|---|---|
| CN | 1719631 | 1/2006 |
| CN | 102214652 | 10/2011 |

(Continued)

OTHER PUBLICATIONS

CNIPA, First Office Action for CN Application No. 202210599996. 7, Jul. 12, 2022.

*Primary Examiner* — Brent A. Fairbanks
*Assistant Examiner* — Molly K Reida
(74) *Attorney, Agent, or Firm* — Hodgson Russ LLP

(57) ABSTRACT

A display panel includes a drive backplane and a plurality of light-emitting chips arranged on the drive backplane. Each of the light-emitting chips includes an N-type semiconductor layer, a multi-quantum well layer and a P-type semiconductor layer arranged on the undoped semiconductor layer in sequence and an undoped semiconductor layer. The undoped semiconductor layer is provided with a conductive via. The light-emitting chip further includes a conductive pattern portion, a part of the conductive pattern portion is located in the conductive via and is in contact with the N-type semiconductor layer, and another part of the conductive pattern portion protrudes from the conductive via and is connected to the drive backplane.

17 Claims, 6 Drawing Sheets

(51) Int. Cl.
　　H10H 29/80　　　(2025.01)
　　H10H 29/85　　　(2025.01)

(56)　　　　　　　References Cited

FOREIGN PATENT DOCUMENTS

| | | |
|---|---|---|
| CN | 108878598 | 11/2018 |
| CN | 109003966 | 12/2018 |
| CN | 111564542 | 8/2020 |
| CN | 112018143 | 12/2020 |
| JP | 2004047847 | 2/2004 |
| KR | 20050104750 | 11/2005 |
| KR | 20130046605 | 5/2013 |
| WO | 2021254177 | 12/2021 |

DISPLAY PANEL AND MANUFACTURING METHOD THEREOF

CROSS-REFERENCE TO RELATED APPLICATIONS

This application claims priority to Chinese Patent Application No. 202210599996.7, filed May 30, 2022, the entire disclosure of which is incorporated herein by reference.

FIELD OF TECHNOLOGY

The present application relates to the field of display technology and, more particularly, to a display panel and a manufacturing method thereof.

BACKGROUND

With the development of photoelectric display technology and semiconductor manufacturing technology, OLED (Organic light-emitting Diode), LCD (Liquid Crystal Display) display technology has been mass-produced. Micro LED (Micro light-emitting Diode) display technology is also being developed. Micro LED display technology is considered as the best display technology in the future because of its high stability, long life, better display effect and higher resolution.

The manufacture of the Micro LED panel needs to transfer millions to tens of millions of Micro LED chips from a growth substrate to a drive backplane. In the process of transferring the Micro LED chip from the growth substrate to a transient substrate, laser lift off is generally adopted, where GaN (gallium nitride) at the bottom of the Micro LED chip is irradiated by laser, so that the GaN decomposes into Ga and N2, separating the Micro LED from the growth substrate. However, in this process, the Micro LED chip will form steps after Mesa process (this process is dry etching), and n-Pad (n-electrode) for connecting n-GaN (n-type gallium nitride) and p-Pad (p-electrode) for connecting p-GaN (p-type gallium nitride) will be fabricated on the steps. At this time, cracks often occur at the steps due to etching, so that during the LLO transfer process, on the one hand, the Micro LED chip is prone to fracture after being irradiated by laser, and on the other hand, the Micro LED chip is also prone to fracture due to uneven adhesive force of the adhesive material on the transient substrate (p-GaN to n-GaN steps on the surface of the LED cause uneven stress) resulting in failure in transfer of the Micro LED chip.

SUMMARY

There are provided a display panel and a manufacturing method of the display panel according to embodiments of the present disclosure. The technical solution is as below:

According to a first aspect of the present disclosure, there is provided a display panel, the display panel includes: a drive backplane; and a plurality of light-emitting chips arranged on the drive backplane. Each of the light-emitting chips including an undoped semiconductor layer, an N-type semiconductor layer, a multi-quantum well layer and a P-type semiconductor layer arranged on the undoped semiconductor layer in sequence The undoped semiconductor layer is provided with a conductive via. The light-emitting chip further includes a conductive pattern portion, a part of the conductive pattern portion is located in the conductive via and is in contact with the N-type semiconductor layer, and another part of the conductive pattern portion protrudes from the conductive via and is connected to the drive backplane.

According to a second aspect of the present disclosure, there is provided a manufacturing method of a display panel, the method includes:

growing an undoped semiconductor layer, an N-type semiconductor layer, a multi-quantum well layer and a P-type semiconductor layer on a substrate in sequence;

forming a transient substrate on a side of the P-type semiconductor layer away from the substrate;

stripping the substrate to expose the undoped semiconductor layer;

patterning the undoped semiconductor layer to form a conductive via on the undoped semiconductor layer;

forming a conductive pattern portion on the undoped semiconductor layer, a part of the conductive pattern portion filling in the conductive via and being in contact with the N-type semiconductor layer, and another part of the conductive pattern portion protruding from the conductive via;

binding and connecting a drive backplane with the part of the conductive pattern portion protruding from the conductive via; and stripping the transient substrate.

It should be understood that the above general description and the following detailed description are exemplary and illustrative only and are not intended to limit the present application.

BRIEF DESCRIPTION OF THE DRAWINGS

The accompanying drawings which are incorporated in and constitute a part of the description illustrate embodiments consistent with the disclosure and together with the description serve to explain the principles of the disclosure. It will be apparent that the drawings described below are only some embodiments of the present disclosure, and other drawings may be obtained from them without creative effort for those of ordinary skill in the art.

DETAILED DESCRIPTION OF THE EMBODIMENTS

Exemplary embodiments will now be described more comprehensively with reference to the accompanying drawings. However, the exemplary embodiments can be implemented in a variety of forms and should not be construed as being limited to the examples set forth herein. Rather, these embodiments are provided so that the present disclosure will be more comprehensive and complete, and the concept of exemplary embodiments will be fully communicated to those skilled in the art.

Further, the described features, structures or characteristics may be incorporated in any suitable manner in one or more embodiments. In the following description, many specific details are provided to give a full understanding of the embodiments of the present application. However, those skilled in the art will appreciate that one or more of the technical solutions of the present application may be practiced without particular details, or other methods, group elements, devices, steps, etc. may be employed. In other instances, well-known methods, devices, implementations or operations are not shown or described in detail to avoid obscuring aspects of the present application.

The present application is described in further detail below in conjunction with the accompanying drawings and specific embodiments. It should be noted here that the technical features involved in the various embodiments of the present application described below can be combined with each other as long as they do not conflict with each other. The embodiments described below by reference to the accompanying drawings are exemplary and are intended to be used for explanation of the present application and are not to be construed as limiting.

Embodiment 1

Figure 1:
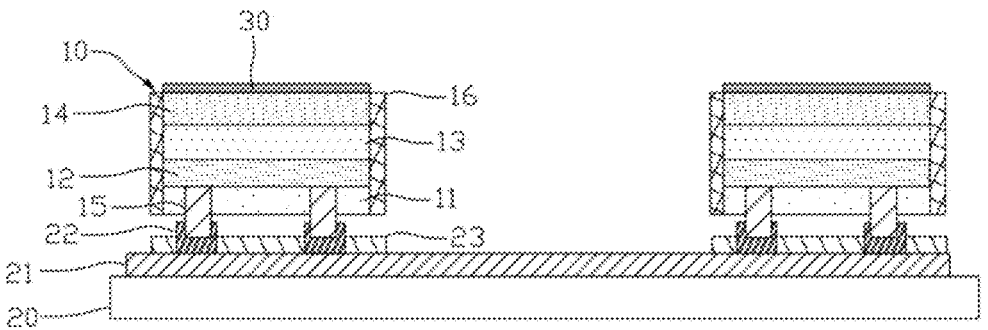
FIG. 1 is a partial cross-sectional structural diagram of a display panel according to an embodiment of the present disclosure.
Figure 2:
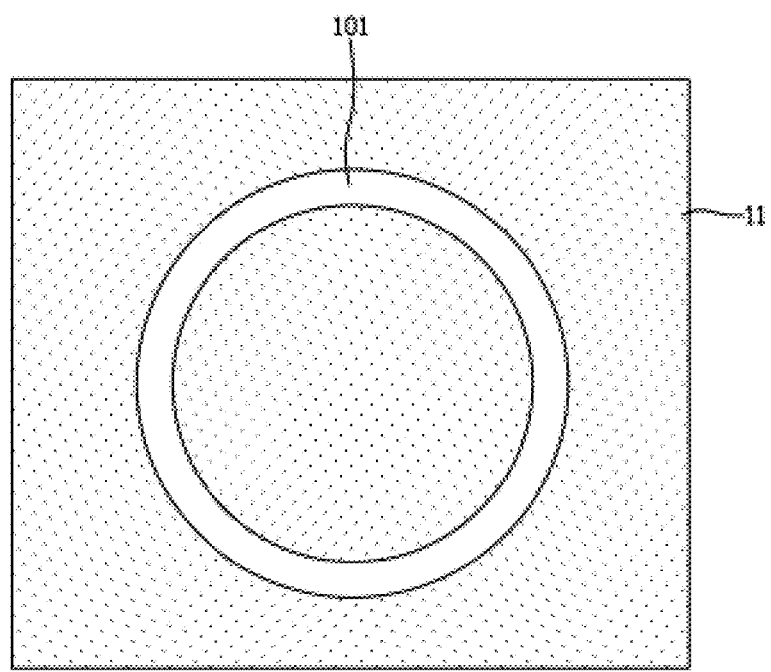
FIG. 2 is a top view of a light-emitting chip with no conductive pattern portion being provided according to a first embodiment of the present disclosure.
Figure 3:
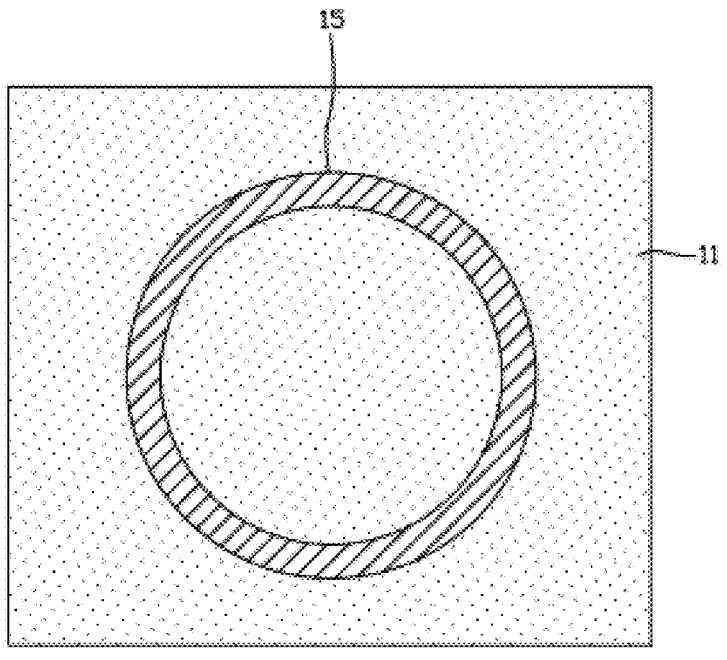
FIG. 3 is a top view of the light-emitting chip provided with a conductive pattern portion according to the first embodiment of the present disclosure.

Referring to FIGS. 1 to 3, an embodiment of the present disclosure provides a display panel. The display panel includes a drive backplane 20 and a plurality of light-emitting chips 10 arranged on the drive backplane 20 in an array.

The light-emitting chip 10 is a micro light-emitting diode chip (Micro LED chip). Each of the light-emitting chips 10 includes an undoped semiconductor layer 11 (U-GaN), an N-type semiconductor layer 12, a multi-quantum well layer 13, and a P-type semiconductor layer 14 stacked on the undoped semiconductor layer 11 in sequence.

It should be understood that the N-type semiconductor layer 12 is an impurity semiconductor layer with a free electron concentration much larger than the hole concentration, and the P-type semiconductor layer 14, also known as the hole-type semiconductor layer, is a semiconductor layer in which the positively charged holes conduct mainly.

As an example, the N-type semiconductor layer 12 is formed of, for example, N-type doped gallium nitride (N-GaN). The P-type semiconductor layer 14 is formed of, for example, P-type doped gallium nitride (P-GaN).

Further, the undoped semiconductor layer 11 is provided with a conductive via 101. The conductive via 101 penetrates through the undoped semiconductor layer 11 so that a side surface of the N-type semiconductor layer 12 close to the undoped semiconductor layer 11 can be partially exposed from the conductive via 101 to facilitate conductive connection between the N-type semiconductor layer 12 and the drive backplane 20.

Accordingly, the light-emitting chip 10 further includes a conductive pattern portion 15 (N-Pad). A part of the conductive pattern portion 15 is located in the conductive via 101 and in contact with the N-type semiconductor layer 12, and another part of the conductive pattern portion 15 extends out of the conductive via 101 and is electrically connected to the drive circuit 21 provided on the drive backplane 20.

In an embodiment of the present disclosure, since the conductive via 101 is provided on the undoped semiconductor layer 11 of the light-emitting chip 10, a side surface of the N-type semiconductor layer 12 adjacent to the undoped semiconductor layer 11 can be partially exposed from the conductive via 101. When a part of the conductive pattern portion 15 is located in the conductive via 101 and is in contact with the N-type semiconductor layer 12, and another part of the conductive pattern portion extends out of the conductive via 101 and is electrically connected to the drive circuit 21 provided on the drive backplane 20, so that the N-type semiconductor layer 12 can be electrically connected to the drive backplane 20. Therefore, the multi-quantum well layer 13 and the P-type semiconductor layer 14 which have the same size and shape as the N-type semiconductor layer 12 and are uniform in thickness can be stacked above the N-type semiconductor layer 12, the probability of fracture of the N-type semiconductor layer 12 and the undoped semiconductor layer 11 due to uneven stress in the process of transferring by LLO (Laser lift off) is reduced, thereby improving the transfer yield of the light-emitting chip 10 and reducing the cost.

In some embodiments, the conductive via 101 fits the conductive pattern portion 15 in shape so that one end of the conductive pattern portion 15 close to the N-type semiconductor layer 12 can all be located in the conductive via 101, and an end portion of the conductive pattern portion 15 is limited by a hole wall of the conductive via 101, so that the conductive pattern portion 15 can be more firmly connected to the conductive via 101. Of course, the conductive via 101 may not fit the shape of the conductive pattern portion 15, so long as the conductive pattern portion 15 can be electrically connected to the N-type semiconductor layer 12, which is not limited herein.

In some embodiments, an orthographic projection of the conductive pattern portion 15 on the drive backplane 20 is annular, and the first electrode may be, for example, in a shape of a circle or a square ring, so that the light-emitting chip 10 does not tilt after the conductive pattern portion 15 is connected to the drive backplane 20.

It should be understood that when the conductive pattern portion 15 is made of an opaque metal material, since the center portion of the ring-shaped conductive pattern portion 15 has a hollow structure, a light-emitting area of the light-emitting chip shielded by the conductive pattern portion 15 can be reduced compared with the conductive pattern portion 15 in a shape of a solid bar.

Alternatively, the conductive pattern portion 15 has a closed loop structure. For example, it has a continuous circular structure. When the conductive pattern portion is in a continuous circular structure, its conductivity and stability after being attached to the driver backplane 20 are better, which improves the transfer yield of the light-emitting chip 10.

In some embodiments, a ratio of an orthographic projection area of the conductive pattern portion 15 on the drive backplane 20 to an orthographic projection area of the light-emitting chip 10 on the drive backplane 20 ranges from 0.1 to 0.3. Optionally, the ratio of the orthographic projection area of the conductive pattern portion 15 on the drive backplane 20 to the orthographic projection area of the light-emitting chip 10 on the drive backplane 20 is 0.1, 0.15, 0.2, 0.25 or 0.3.

Alternatively, orthographic projections of the undoped semiconductor layer 11, the N-type semiconductor layer 12, the multi-quantum well layer 13, and the P-type semiconductor layer 14 of the light-emitting chip 10 on the drive backplane 20 completely coincide with each other, and the orthographic projection of the conductive pattern portion 15 on the drive backplane 20 lies within the orthographic projection of the undoped semiconductor layer 11, the N-type semiconductor layer 12, the multi-quantum well layer 13, or the P-type semiconductor layer 14 on the drive backplane 20.

It should be understood that the ratio of the orthographic projection area of the conductive pattern portion 15 on the drive backplane 20 to the orthographic projection area of the light-emitting chip 10 on the drive backplane 20 ranges from 0.1 to 0.3. That is, the ratio of the orthographic projection area of the conductive pattern portion 15 on the drive backplane 20 to the orthographic projection area of the undoped semiconductor layer 11, the N-type semiconductor layer 12, the multi-quantum well layer 13, or the P-type semiconductor layer 14 on the drive backplane 20 ranges from 0.1 to 0.3. In this case, the conductive pattern portion 15 can ensure that it can support the undoped semiconductor layer 11, the N-type semiconductor layer 12, the multi-quantum well layer 13, or the P-type semiconductor layer 14 without either distorting or shielding the light-emitting area of the larger light-emitting chip 10.

In some embodiments, a difference between an outer diameter of the conductive pattern portion 15 and an inner diameter of the conductive pattern portion 15 ranges from 2 to 5 μm. Alternatively, the difference between the outer diameter of the conductive pattern portion 15 and the inner diameter of the conductive pattern portion 15 is 2.5 μm, 3 μm, 3.5 μm, or 4 μm.

It should be understood that when the conductive pattern portion 15 has an annular structure, for example, the difference between the outer diameter of the conductive pattern portion 15 and the inner diameter of the conductive pattern portion 15 is in the range of 2 to 5 μm, that is, a width of the conductive pattern portion 15 in a radial direction is 2 to 5 μm. In this case, the conductive pattern portion 15 is sufficient to support the undoped semiconductor layer 11, the N-type semiconductor layer 12, the multi-quantum well layer 13, and the P-type semiconductor layer 14 without deformation.

Alternatively, the conductive pattern portion 15 is a metal pattern made of a material such as gold, manganese, cadmium, aluminum or the like, which makes the conductive pattern portion 15 have better conductivity and higher thickness, so that the conductive pattern portion 15 is protruded from the conductive via 101.

Alternatively, the conductive pattern portion 15 may be made of, for example, a transparent conductive material, such as indium tin oxide (ITO), indium zinc oxide (IZO), or a conductor formed by ion doping of indium gallium zinc oxide (IGZO), which can reduce the influence of the conductive pattern portion 15 on the light-emitting chip 10.

In some embodiments, the display panel further includes a transparent conductive layer 30, the transparent conductive layer 30 is located on a side of the P-type semiconductor layer 14 away from the drive backplane 20, and the transparent conductive layer 30 is connected to the drive backplane 20 through leads.

Alternatively, the transparent conductive layer 30 is made of, for example, indium tin oxide (ITO), indium zinc oxide (IZO) or the like.

It should be understood that when the transparent conductive layer 30 is, for example, indium tin oxide (ITO), since the indium tin oxide (ITO) is a transparent and high work function material, it facilitates hole injection while not affecting light emission from the light-emitting chip 10, and plays a current diffusion role.

Further, the side of the P-type semiconductor layer 14 of each individual light-emitting chip 10 away from the drive backplane 20 is covered with the transparent conductive layer 30, and the transparent conductive layer 30 is electrically connected to the P-type semiconductor layer 14. The transparent conductive layers 30 on each light-emitting chip 10 can be electrically connected each other to form a whole. And then, for example, leads are connected with the transparent conductive layer 30 from the side of the transparent conductive layer 30, and the transparent conductive layers 30 is electrically connected to a positive signal on the drive backplane 20 without additional production of the P-type electrode (P-Pad) originally used for conductive connection with the P-type semiconductor layer 14. Further, the leads are connected from the side surface of the transparent conductive layer 30 to ensure that the surface of the transparent conductive layer 30 is uniform, thereby reducing the probability that the light-emitting chip 10 breaks due to uneven adhesive force on the transient substrate during the transfer from the transient substrate 40 to the transient substrate 50.

In some embodiments, the drive backplane 20 is provided with a reflective layer 23 made of a metal material such as silver or magnesium. The reflective layer 23 is located between the drive backplane 20 and the light-emitting chip 10, and the orthographic projection of the light-emitting chip 10 on the drive backplane 20 is located in the reflective layer 23. The conductive pattern portion 15 is electrically connected to the drive backplane 20, and the reflective layer 23 is insulated from both the conductive pattern portion 15 and the drive backplane 20.

For example, the reflective layer 23 is provided with a via filled with a conductive connection portion 22 made of a metal material such as indium or tin. The conductive connection portion 22 is electrically connected to the drive circuit 21 on the drive backplane 20 and is insulated from the reflective layer 23. One end of the conductive pattern portion 15 can be fixed to the corresponding indium or tin dot by heating and melting indium or tin so that the conductive pattern portion 15 can be electrically connected to the drive circuit 21 on the drive backplane 20.

It should be understood that some of the light emitted by the light-emitting chip 10 during operation irradiates the drive backplane 20 from one side of the P-type semiconductor layer 14, therefore, by providing the reflective layer 23 on the drive backplane 20 and making the reflective layer 23 located directly below the light-emitting chip 10, and the orthographic projection of the light-emitting chip 10 on the drive backplane 20 located in the reflective layer 23, it is possible to reflect light irradiated by the light-emitting chip 10 from one side of the P-type semiconductor layer 14 in the direction of the drive backplane 20 in an original path, so that all light emitted by the light-emitting chip 10 can come out from one side of the drive backplane 20 toward the P-type semiconductor layer 14.

In some embodiments, the light-emitting chip 10 also includes a protective layer 16 made of silicon oxide. The protective layer 16 covers the undoped semiconductor layer 11, the N-type semiconductor layer 12, the multi-quantum well layer 13, and the P-type semiconductor layer 14, while a bottom surface of the undoped semiconductor layer 11 facing the drive backplane 20 is not covered by the protective layer 16 to facilitate the arrangement of the conductive pattern portion 15. A top surface of the P-type semiconductor layer 14 away from the drive backplane 20 is also not covered by the protective layer 16 to facilitate the arrangement of the transparent conductive layer 30.

To sum up, in the embodiments of the present disclosure, the multi-quantum well layer 13 and the P-type semiconductor layer 14 which have the same size and shape as the N-type semiconductor layer 12 and are uniform in thickness can be stacked above the N-type semiconductor layer 12, the probability of fracture of the N-type semiconductor layer 12 and the undoped semiconductor layer 11 due to uneven stress in the process of transferring by LLO (Laser lift off) is reduced, thereby improving the transfer yield of the light-emitting chip 10 and reducing the cost. At the same time, the transparent conductive layer 30 made of indium tin oxide (ITO) can be formed by PVD and photolithography, and the transparent conductive layer 30 and the drive backplate 20 are connected by leads. The indium tin oxide is a transparent and high work function material, which does not affect LED light emission and is beneficial to hole injection, and can omit the manufacture of P-type electrode (P-Pad) and reduce the cost. In addition, the production of P-Pad is omitted, thus the problem of uneven surface of the transparent conductive layer 30 is solved, and the plastic material on the transient substrate 50 can be uniformly and evenly attached to the light-emitting chip 10 during the transfer of the light-emitting chip 10 from the transient substrate 40 to the transient substrate 50, thereby reducing the probability that the light-emitting chip 10 will break and finally improving the problem of transfer failure of the light-emitting chip 10.

Embodiment 2

Figure 4:
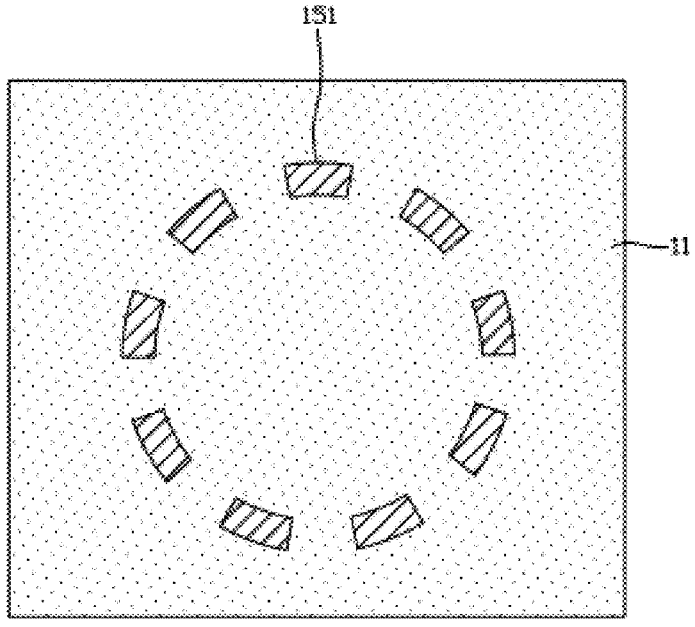
FIG. 4 is a top view of a light-emitting chip provided with a conductive pattern portion according to a second embodiment of the present disclosure.

Referring to FIGS. 1 and 4, the light-emitting chip of this embodiment is roughly the same as the light-emitting chip of the first embodiment, and there is also a difference, for example, the conductive pattern portion of this embodiment is different from the conductive pattern portion of the first embodiment in structure.

Specifically, in this embodiment, the conductive pattern portion 15 includes a plurality of conductive portions 151 arranged at intervals, and both ends of each of the conductive portions 151 are electrically connected to the N-type semiconductor layer 12 and the drive circuit 21 on the drive backplane 20, respectively. The plurality of conductive portions 151 are arranged in a ring shape, for example, a discontinuous circular structure. When the conductive pattern portion 15 has a discontinuous circular structure, it is possible to further reduce the light-emitting area of the light-emitting chip 10 shielded by the conductive pattern portion 15 while ensuring the conductive performance and stability of the conductive pattern portion 15.

Pitches between every two adjacent conductive portions 151 are equal so that the light-emitting chip 10 does not tilt after the conductive portions 151 are connected to the drive backplane 20.

Further, the ratio of the pitch between two adjacent conductive portions 151 to the length of the conductive portion 151 in the circumferential direction ranges from 0.5 to 3. Optionally, the ratio of the pitch between two adjacent conductive portions 151 to the length of the conductive portion 151 in the circumferential direction is 1, 1.8, 1.5, 2 or 2.5. At this time, the light-shielding area formed by the conductive pattern portion 15 on the light-emitting chip 10 can be minimized while ensuring that the light-emitting chip 10 does not tilt after the conductive portions 151 are connected to the drive backplane 20.

Accordingly, the conductive via 101 may be composed of a plurality of contact holes matched with the conductive portions 151, and the contact holes are provided at intervals, or it may be a continuous annular hole.

Please refer to the first embodiment for other configurations of the light-emitting chip 10, which will not be described here.

Embodiment 3

As shown in FIGS. 5 to 16, embodiment 3 of the present disclosure provides a manufacturing method of a display panel, so as to manufacture the display panel of embodiment 1 or embodiment 2, and the manufacturing method at least includes:

S1: growing an undoped semiconductor layer 11, an N-type semiconductor layer 12, a multi-quantum well layer 13 and a P-type semiconductor layer 14 on a substrate in sequence;

S2: forming a transient substrate 50 on a side of the P-type semiconductor layer 14 away from the substrate 40;

S3: stripping the substrate 40 to expose the undoped semiconductor layer 11;

S4: patterning the undoped semiconductor layer 11 to form a conductive via 101 on the undoped semiconductor layer 11;

S5: forming a conductive pattern portion 15 on the undoped semiconductor layer 11, a part of the conductive pattern portion 15 filling in a conductive via 101 and being in contact with the N-type semiconductor layer 12, and another part of the conductive pattern portion 15 protruding from the conductive via 101;

S6: binding and connecting the drive backplane 20 with a part of the conductive pattern portion 15 protruding from the conductive via 101; and S7: stripping the transient substrate to form the light-emitting chip 10.

Figure 5:
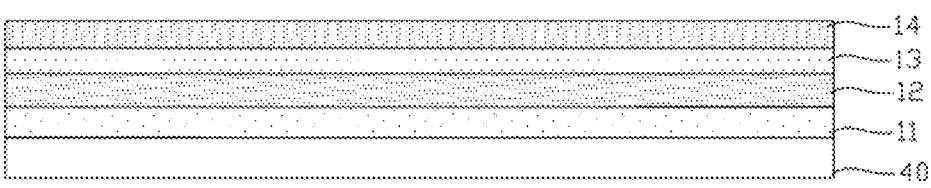
FIG. 5 to FIG. 15 respectively are structural diagrams of steps S1-S9 of a manufacturing method of a display panel according to a third embodiment of the present disclosure.

In the embodiment of the present disclosure, the specific steps of the manufacturing method of the display panel are as follows:

As shown in FIG. 5, the substrate 40 made of sapphire is provided, and epitaxy is performed by MOCVD so that the undoped semiconductor layer 11, the N-type semiconductor layer 12, the multi-quantum well layer 13, and the P-type semiconductor layer 14 are sequentially grown on the substrate 40.

As an example, the N-type semiconductor layer 12 is formed of, for example, N-type doped gallium nitride (N-GaN). The P-type semiconductor layer 14 is formed of, for example, P-type doped gallium nitride (P-GaN).

It should be understood that the undoped semiconductor layer 11 serves to improve stresses and defects caused by lattice mismatch between the material of the substrate 40 and gallium nitride base material. The electrons provided by the N-type semiconductor layer 12 and the holes provided by the P-type semiconductor layer 14 migrate to the multi-quantum well layer 13 to be able to compound luminescence.

Figure 6:
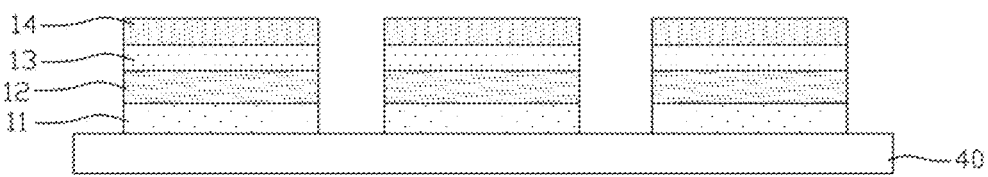

As shown in FIG. 6, the undoped semiconductor layer 11, the N-type semiconductor layer 12, the multi-quantum well layer 13, and the P-type semiconductor layer 14 are patterned, that is, according to the designed size of light-emitting chip 10, the undoped semiconductor layer 11, the N-type semiconductor layer 12, the multi-quantum well layer 13 and the P-type semiconductor layer 14 are exposed to form patterns, then, ICP (Inductively Coupled Plasma) etching (etching gas is chlorine and boron chloride $Cl_2$/$BCl_3$) is performed to divide the epitaxial layer into a plurality of light-emitting parts arranged at intervals, and each light-emitting part includes the undoped semiconductor layer 11, the N-type semiconductor layer 12, the multi-quantum well layer 13 and the P-type semiconductor layer 14, so as to facilitate the subsequent formation of a plurality of light-emitting chips 10 arranged at intervals.

Figure 7:
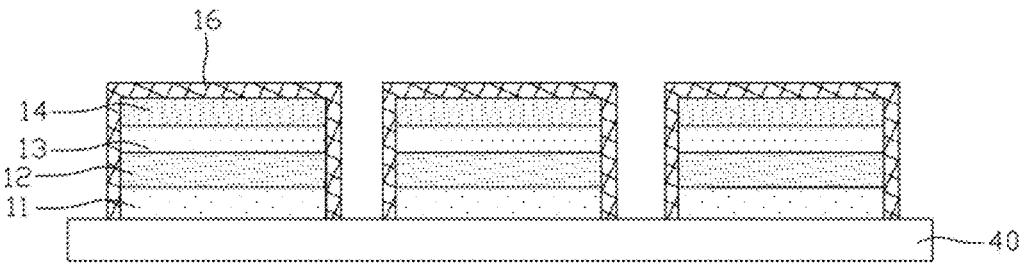

As shown in FIG. 7, a vapor deposition (CVD) method is adopted first, silicon oxide covering an entire surface of the light-emitting part is deposited on the substrate 40, then a photoresist covering the silicon oxide is formed on the substrate 40, the photoresist is exposed and developed, and finally the silicon oxide is etched to separate the entire surface of the silicon oxide to form a plurality of independent protective layers 16, and each protective layer 16 correspondingly covers each light-emitting part to protect the light-emitting part from being affected in the subsequent manufacturing process.

Figure 8:
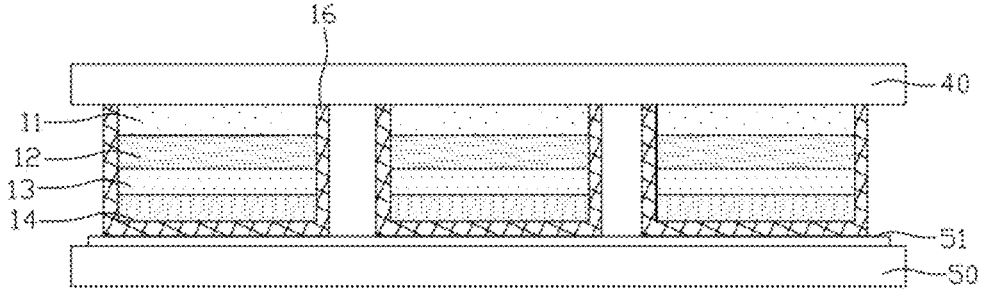
Figure 9:
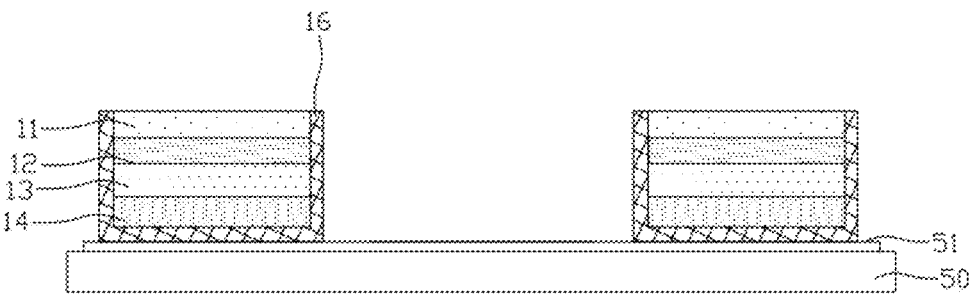

As shown in FIGS. 8 and 9, a transient substrate 50 with a photolysis 51 or a pyrolytic gel material is provided, the transient substrate 50 is placed on a side of the P-type semiconductor layer 14 away from the substrate 40, and the photolysis 51 or the pyrolytic gel material is located between the protective layer 16 and the transient substrate 50.

As shown in FIGS. 8 and 9, each light-emitting part is transferred to the transient substrate 50 by a selective LLO (Laser lift off). Specifically, the undoped semiconductor layer 11 is irradiated with laser light from the side of the substrate 40, so that gallium nitride in the undoped semi-conductor layer 11 on the side close to the substrate 40 is decomposed into gallium and nitrogen gas, whereby the light emitting part is detached from the substrate 40, and the undoped semiconductor layer 11 is exposed. When the selective LLO (Laser lift off) is conducted, transferring is required according to the gap between the two pixel regions on the drive backplane 20, so that the light-emitting part corresponds to the pixel region on the drive backplane 20 one by one.

Figure 10:
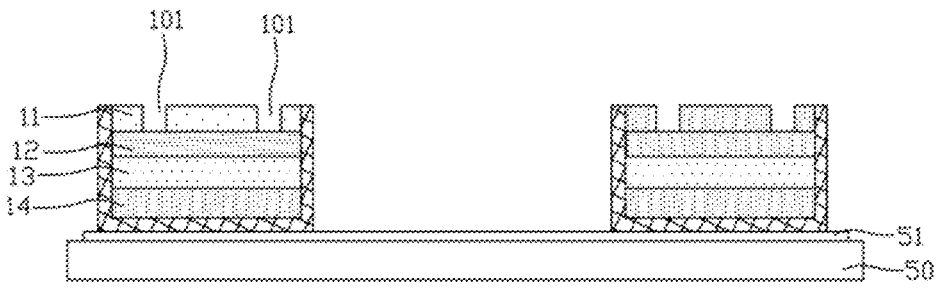

As shown in FIG. 10, the undoped semiconductor layer 11 originally covered by the substrate 40 is patterned by exposure, that is, a pattern is formed by exposure, and then the undoped semiconductor layer 11 covered on the N-type semiconductor layer 12 is etched by ICP etching to expose the N-type semiconductor layer 12, thereby forming a conductive via 101 on the undoped semiconductor layer 11.

Figure 11:
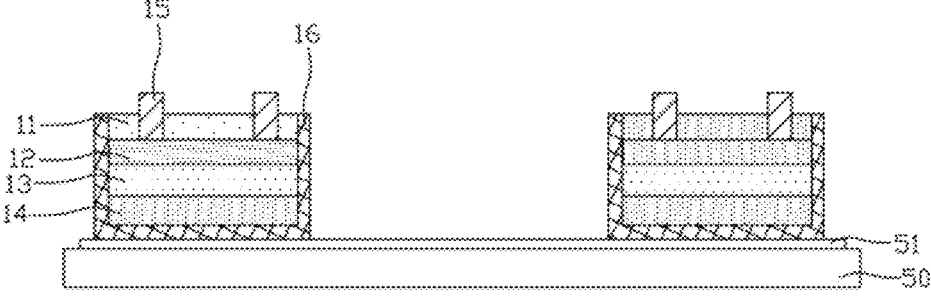

As shown in FIG. 11, a entire conductive layer formed of a metal material such as gold, manganese, cadmium, or aluminum is evaporated on the undoped semiconductor layer 11, and a part of the conductive layer is filled into the conductive via 101 and comes into contact with the N-type semiconductor layer 12. The conductive layer is patterned so that a conductive pattern portion 15 (N-Pad) is formed by the conductive layer, one end of the conductive pattern portion 15 is electrically connected to the N-type semiconductor layer 12, and then the light-emitting part is formed to be a light-emitting chip 10.

Alternatively, the conductive pattern portion 15 may have a closed loop structure, for example, a continuous circular structure. The conductive pattern portion 15 may include a plurality of conductive portions 151 arranged at intervals, and both ends of each conductive portion 151 are electrically connected to the N-type semiconductor layer 12 and the drive circuit 21 on the drive backplane 20, respectively. The plurality of conductive portions 151 are also arranged in a ring shape, for example, in a discontinuous circular structure.

Figure 12:
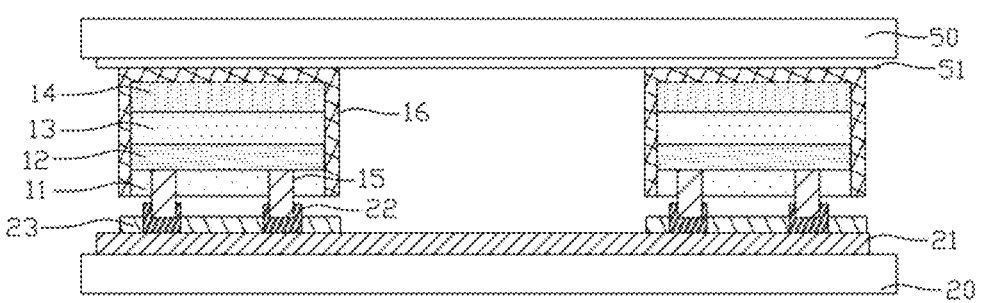
Figure 13:
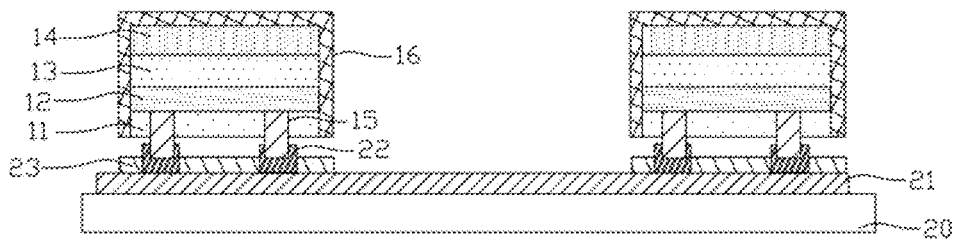

As shown in FIGS. 12 and 13, the drive backplane 20 is provided, and the drive circuit 21 is provided on the drive backplane 20. A conductive connection portion 22 formed of indium or tin is provided at the connection of the conductive pattern portion 15 and the drive circuit 21. The conductive connection portion 22 formed by heating and melting indium or tin is then cooled, so that the conductive pattern portion 15 is fixed to the corresponding conductive connection portion 22. And finally, the transient substrate 50 is removed from the light-emitting chip 10 by photolysis or pyrolysis according to the adhesive material characteristics of the transient substrate 50, so as to expose the protective layer 16.

Further, the drive backplane 20 is provided with a reflective layer 23 (the reflective layer 23 is made of a material such as silver or magnesium) at a position corresponding to the light-emitting chip 10. The reflective layer 23 is located between the drive backplane 20 and the light-emitting chip 10, and the orthographic projection of the light-emitting chip 10 on the drive backplane 20 is located in the reflective layer 23. Accordingly, the reflective layer 23 is provided with a via filled with the conductive connection portion 22, and the reflective layer 23 is insulated from the conductive pattern portion 15, the conductive connection portion 22 and the drive backplane 20.

Figure 14:
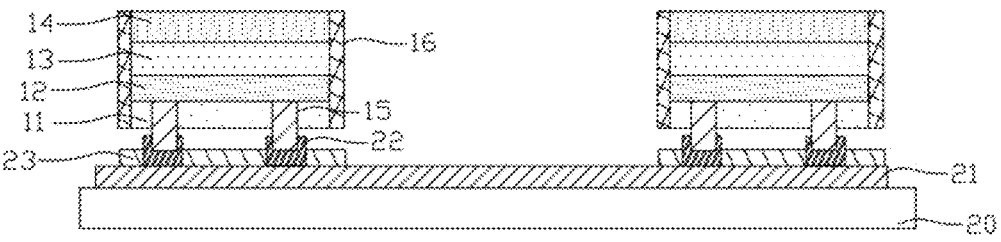
Figure 15:
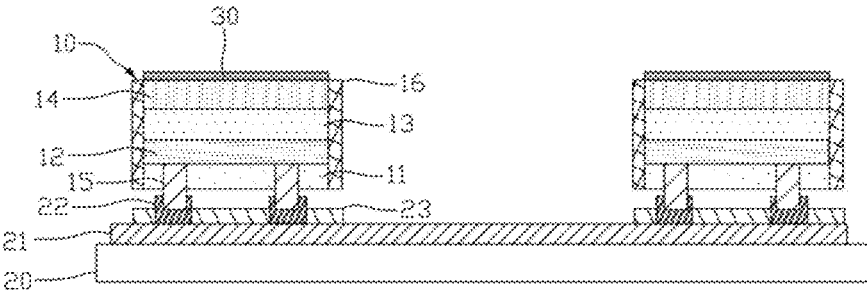
Figure 16:
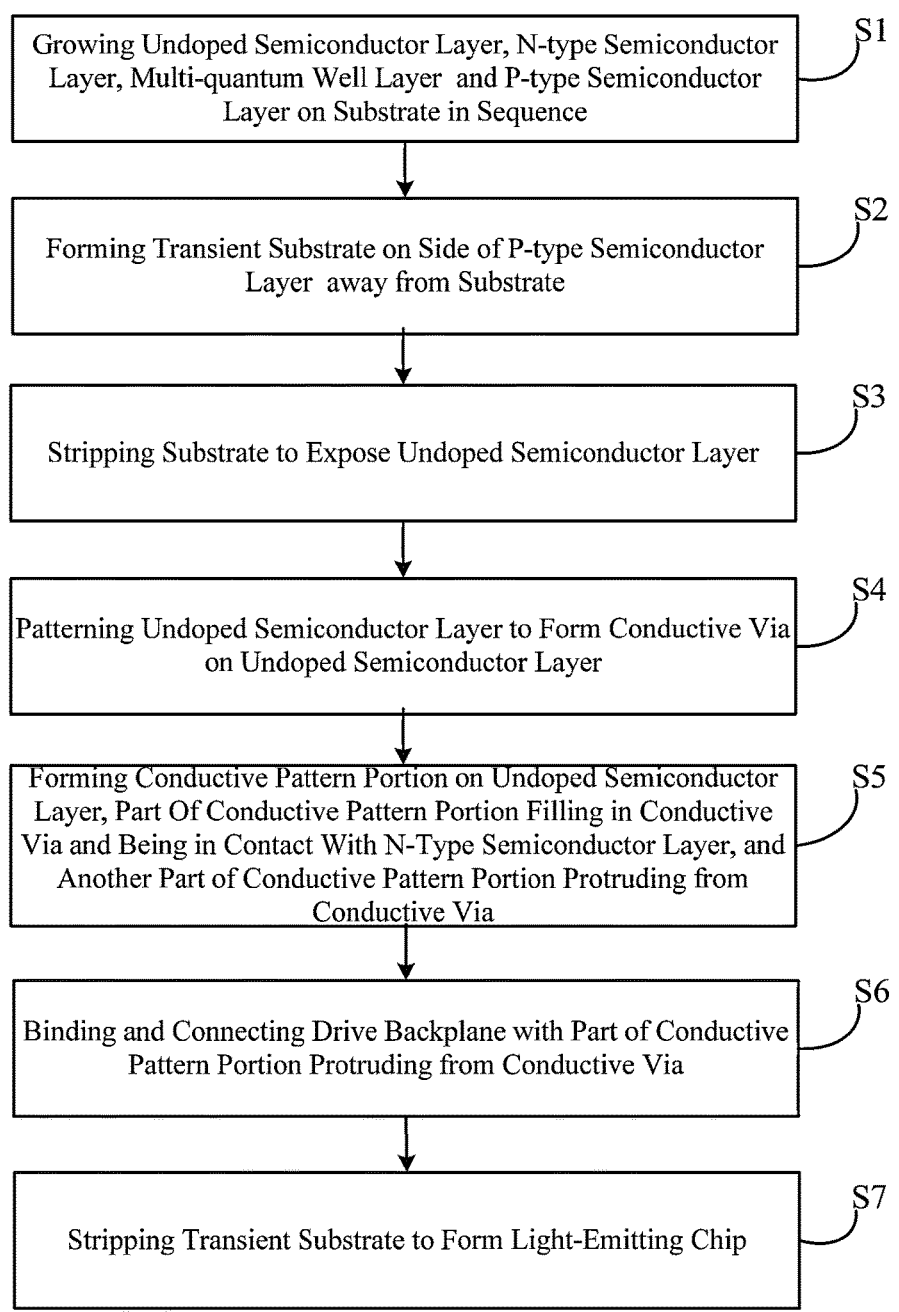
FIG. 16 is a flow chart of the manufacturing method of the display panel according to the third embodiment of the present disclosure.

As shown in FIGS. 14 and 15, by dry etching, the protective layer 16 on the P-type semiconductor layer 14 is removed, to expose the P-type semiconductor layer 14 of the light-emitting chip 10. Indium tin oxide (ITO) is fabricated on the exposed P-type semiconductor layer 14 by PVD (Physical Vapor Deposition), and then a transparent conductive layer 30 is formed of indium tin oxide (ITO) through photolithography. The transparent conductive layer 30 is electrically connected to the drive circuit 21 of the drive backplane 20 through leads, and the transparent conductive layer 30 formed by indium tin oxide (ITO) transmits a positive signal. As the indium tin oxide is transparent and high work function material, the light emit of the light emitting chip 10 is not affected, the hole injection is facilitated, and the current diffusion effect is achieved, so that the manufacturing of the display panel is complete.

To sum up, the manufacturing method of the display panel according to the embodiment of the present disclosure includes sequentially growing the undoped semiconductor layer 11, the N-type semiconductor layer 12, the multi-quantum well layer 13 and the P-type semiconductor layer 14 on the substrate 40 from bottom to top; and separating the undoped semiconductor layer 11, the N-type semiconductor layer 12, the multi-quantum well layer 13, and the P-type semiconductor layer 14 into a plurality of individual light-emitting parts by ICP etching according to the size of the designed light-emitting chip 10, thereby facilitating the subsequent formation of a plurality of light-emitting chips 10 that are individually arranged.

Then, the light-emitting part is protected by using CVD and photolithography to form the protective layer 16 formed of silicon oxide (no electrode fabrication and no Mesa process for the time being), so that the surface of the light-emitting part is flat, and the uneven force applied to the light-emitting chip 10 during transfer can be improved.

What follows is the first transferring, the light-emitting parts are selectively transferred to the transient substrate 50 by selective LLO, and the pitch between the two light-emitting parts is made to correspond to the pitch of the two pixels on the drive backplane 20. Since the pitch of the two light-emitting chips 10 on the growth substrate is usually small, it is possible to prepare more light-emitting chips 10 on a single substrate 40, so as to reduce the cost.

Next, evaporation and photolithography processes are performed on the light-emitting part on the transient substrate 50 to form the conductive pattern portion 15 on the light-emitting part, thereby forming the light-emitting chip 10. Since the conductive pattern portion 15 is annular rather than rod-shaped, the probability that the light-emitting chip 10 will be tilted when bonding to the drive backplane 20 can be reduced.

Finally, the light-emitting chip 10 on the transient substrate 50 is transferred and bonded on the drive backplane 20. After all the light-emitting chips 10 are transferred, the transparent conductive layer 30 made of ITO material is formed by PVD and photolithography, and is connected to the P-type semiconductor layer 14 on the light-emitting chip 10, and then the transparent conductive layer 30 and the drive backplane 20 are electrically conductive through leads. Because ITO is a transparent and high work function material, it can facilitate hole injection without affecting the light emitting of LED.

Therefore, the manufacturing method of the display panel of the embodiment of the present disclosure avoids the mesa process as a whole, also omits the fabrication of the P-type electrode pattern (P-Pad), and can complete the transferring and bonding of the light-emitting chip 10 on the drive backplane 20 by one transferring, ultimately not only improves the transferring success rate of the light-emitting chip 10, but also reducing the cost.

In addition, the terms of "first", "second" are for descriptive purposes only and cannot be construed as indicating or implying relative importance or implying the number of the indicated technical features. Thus, the features defined as "first" or "second" may be explicitly or implicitly defined as including one or more of the features. In the description of the present application, "a plurality of" means two or more, unless explicitly and specifically defined otherwise.

In the present application, the terms "assembly", "connection" and the like are understood in a broad sense and may be, for example, a fixed connection, a detachable connection, or as a unit, unless otherwise expressly specified and limited; the connection can be a mechanical connection or an electrical connection; or the connection can be a directly connection or an indirect connection by intermediate media, and it can be the internal communication of two elements or the interaction between two elements. For those ordinarily skilled in the art, the specific meanings of the above terms in the present application will be understood according to the specific circumstances.

In the description of this description, illustrations of the reference terms "some embodiments", "exemplified", etc. mean that specific features, structures, materials, or features described in connection with the embodiment or example are included in at least one embodiment or example of the present application. In this description, the schematic formulation of the above terms need not be directed to the same embodiments or examples. Further, the specific features, structures, materials or characteristics described may be combined in a suitable manner in any one or more embodiments or examples. Further, without contradicting one another, those skilled in the art may connect and combine different embodiments or examples described in this description and features of different embodiments or examples.

Although the embodiments of the present application have been shown and described above, understandably, the above-described embodiments are exemplary and cannot be construed as limiting the present application. Those of ordinary skill in the art may make changes, modifications, substitutions and modifications to the above-described embodiments within the scope of the present application.

Therefore, any changes or modifications made in accordance with the claims and descriptions of the present application should fall within the scope of the present application.

The invention claimed is:

1. A display panel comprising:
 a drive backplane; and
 a plurality of light-emitting chips arranged on the drive backplane, each of the light-emitting chips comprising:
  an undoped semiconductor layer provided with a conductive via;
  an N-type semiconductor layer;
  a multi-quantum well layer;
  a P-type semiconductor layer, wherein the N-type semiconductor layer, the multi-quantum well layer and the P-type semiconductor layer arranged on the undoped semiconductor layer in sequence; and
  a conductive pattern portion, wherein a part of the conductive pattern portion is located in the conductive via and is in contact with the N-type semiconductor layer, and another part of the conductive pattern portion protrudes from the conductive via and is connected to the drive backplane;
 wherein a reflective layer is disposed on the drive backplane, the reflective layer being insulated from the conductive pattern portion and the drive backplane, the reflective layer being located between the drive backplane and the light-emitting chip, and an orthographic projection of the light-emitting chip on the drive backplane is located in the reflective layer;
 wherein the reflective layer is provided with a via, the via being provided with a conductive connection portion, the conductive connection portion being electrically connected to the drive backplane and insulated from the reflective layer, and wherein the conductive pattern portion is electrically connected to the conductive connection portion.

2. The display panel according to claim 1, wherein an orthographic projection of the conductive pattern portion on the drive backplane is annular.

3. The display panel according to claim 2, wherein the conductive pattern portion is a closed loop structure.

4. The display panel according to claim 2, wherein the conductive pattern portion comprises a plurality of conductive portions arranged at intervals, and each of the conductive portions is arranged in a ring shape.

5. The display panel according to claim 4, wherein a pitch between every two adjacent conductive portions is equal, and a ratio of the pitch between the two adjacent conductive portions to a length of the conductive portion in a circumferential direction ranges from 0.5 to 3.

6. The display panel according to claim 1, wherein a ratio of an orthographic projection area of the conductive pattern portion on the drive backplane to an orthographic projection area of the light-emitting chip on the drive backplane ranges from 0.1 to 0.3.

7. The display panel according to claim 6, wherein a difference between an outer diameter of the conductive pattern portion and an inner diameter of the conductive pattern portion ranges from 2 to 5 μm.

8. The display panel according to claim 1, wherein the conductive pattern portion is a metal pattern, wherein the display panel further comprises a transparent conductive layer located on a side of the P-type semiconductor layer away from the drive backplane, and wherein the transparent conductive layer is connected to the drive backplane through leads.

9. A method of manufacturing a display panel comprising:

growing an undoped semiconductor layer, an N-type semiconductor layer, a multi-quantum well layer and a P-type semiconductor layer on a substrate in sequence;

forming a transient substrate on a side of the P-type semiconductor layer away from the substrate;

stripping the substrate to expose the undoped semiconductor layer;

patterning the undoped semiconductor layer to form a conductive via on the undoped semiconductor layer;

forming a conductive pattern portion on the undoped semiconductor layer, a part of the conductive pattern portion filling in the conductive via and being in contact with the N-type semiconductor layer, so that a light-emitting chip is formed, and another part of the conductive pattern portion protruding from the conductive via;

providing a drive backplane;

forming a drive circuit on the drive backplane;

forming a reflective layer at a position corresponding to each light-emitting chip, and forming a via on the reflective layer for filling a conductive connection portion, wherein the reflective layer is insulated from the conductive pattern portion, the conductive connection portion and the drive backplane, and wherein an orthographic projection of the light-emitting chip on the drive backplane is located in the reflective layer;

forming a conductive connection portion at a connection of the conductive pattern portion and the drive circuit by heating and melting indium or tin, wherein the conductive pattern portion is electrically connected to the conductive connection portion;

binding and connecting the drive backplane with the part of the conductive pattern portion protruding from the conductive via, and stripping the transient substrate.

10. The method according to claim 9, wherein after growing the undoped semiconductor layer, the N-type semiconductor layer, a multi-quantum well layer and the P-type semiconductor layer on the substrate in sequence, the method further comprises:

exposing the undoped semiconductor layer, the N-type semiconductor layer, the multi-quantum well layer and the P-type semiconductor layer;

performing Inductively Coupled Plasma etching to divide the undoped semiconductor layer, the N-type semiconductor layer, the multi-quantum well layer and the P-type semiconductor layer into a plurality of light-emitting parts arranged at intervals, so as to form a plurality of light-emitting chips.

11. The method according to claim 10, wherein before forming the transient substrate on the side of the P-type semiconductor layer away from the substrate, the method further comprises:

forming a plurality of independent protective layers, wherein each protective layer covers each light-emitting part.

12. The method according to claim 11, wherein before forming the transient substrate on the side of the P-type semiconductor layer away from the substrate, the method further comprises:

forming a photolysis or a pyrolytic gel material on the transient substrate, wherein the photolysis or the pyrolytic gel material is located between the protective layer and the transient substrate.

13. The method according to claim 12, wherein after stripping the transient substrate, the method further comprises:

removing each protective layer on the P-type semiconductor layer by dry etching to expose the P-type semiconductor layer;

forming a transparent conductive layer on the exposed P-type semiconductor layer; and connecting the transparent conductive layer with the drive circuit of the drive backplane through leads.

14. The method according to claim 9, wherein an orthographic projection of the conductive pattern portion on the drive backplane is annular.

15. The method according to claim 14, wherein the conductive pattern portion is a closed loop structure.

16. The method according to claim 14, wherein the conductive pattern portion comprises a plurality of conductive portions arranged at intervals, and each of the conductive portions is arranged in a ring shape.

17. The method according to claim 16, wherein a pitch between two adjacent conductive portions is equal, and a ratio of the pitch between the two adjacent conductive portions to a length of the conductive portion in a circumferential direction ranges from 0.5 to 3.

* * * * *